US010050071B2

(12) United States Patent
Itonaga et al.

(10) Patent No.: US 10,050,071 B2
(45) Date of Patent: Aug. 14, 2018

(54) IMAGING UNIT, LENS BARREL, AND PORTABLE TERMINAL

(71) Applicant: SONY CORPORATION, Tokyo (JP)

(72) Inventors: Kazuichiro Itonaga, Tokyo (JP); Eigo Sano, Tokyo (JP); Nobuyoshi Mori, Tokyo (JP); Joji Wada, Tokyo (JP); Atsushi Morimura, Tokyo (JP); Yuichi Takenaga, Tokyo (JP); Takayoshi Hasegawa, Tokyo (JP); Makoto Tsunoda, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/101,062

(22) PCT Filed: Sep. 29, 2014

(86) PCT No.: PCT/JP2014/075847
§ 371 (c)(1),
(2) Date: Jun. 2, 2016

(87) PCT Pub. No.: WO2015/087599
PCT Pub. Date: Jun. 18, 2015

(65) Prior Publication Data
US 2017/0005125 A1    Jan. 5, 2017

(30) Foreign Application Priority Data

Dec. 9, 2013 (JP) .................................. 2013-253901

(51) Int. Cl.
*H01L 31/0232*    (2014.01)
*H04N 3/14*    (2006.01)
(Continued)

(52) U.S. Cl.
CPC ........ *H01L 27/14607* (2013.01); *G02B 5/005* (2013.01); *G02B 7/02* (2013.01);
(Continued)

(58) Field of Classification Search
CPC ...................................................... H01L 27/146
(Continued)

(56) References Cited

U.S. PATENT DOCUMENTS 6,791,072 B1 * 9/2004 Prabhu .............. H01L 27/14601
250/208.1
7,390,687 B2 * 6/2008 Boettiger .......... H01L 27/14601
257/E27.13
(Continued)

FOREIGN PATENT DOCUMENTS

JP    09-284617 A    10/1997
JP    2004-104259 A    4/2004
(Continued)

OTHER PUBLICATIONS

International Search report on patentability received for PCT Application No. PCT/JP2014/075847, dated Dec. 16, 2014, pp. 2.
(Continued)

*Primary Examiner* — David Vu
*Assistant Examiner* — Brandon Fox
(74) *Attorney, Agent, or Firm* — Chip Law Group

(57) ABSTRACT

To obtain an imaging unit, a lens barrel, and a portable terminal which can effectively suppress spring-back of solid-state imaging elements, while facilitating height lowering thereof. An imaging unit includes: a solid-state imaging element; and an imaging lens for forming a subject image on a photoelectric conversion part of the solid-state imaging element. An imaging surface of the solid-state imaging element is curved in a manner that a peripheral side is inclined toward an object side relative to a screen center.

(Continued)

The imaging lens constrains the solid-state imaging element to prevent a radius of curvature of the imaging surface from varying. Thus, field curvature, distortion aberration, and comatic aberration are appropriately corrected.

11 Claims, 19 Drawing Sheets

(51) Int. Cl.
  H01L 27/00 (2006.01)
  H01L 27/146 (2006.01)
  G02B 7/02 (2006.01)
  H04N 5/225 (2006.01)
  G02B 5/00 (2006.01)
  G02B 7/14 (2006.01)
  G02B 13/00 (2006.01)
  G02B 27/00 (2006.01)

(52) U.S. Cl.
  CPC ............ *G02B 7/021* (2013.01); *G02B 7/025* (2013.01); *G02B 7/14* (2013.01); *G02B 13/001* (2013.01); *G02B 27/0025* (2013.01); *H01L 27/14601* (2013.01); *H01L 27/14618* (2013.01); *H01L 27/14621* (2013.01); *H01L 27/14625* (2013.01); *H01L 27/14627* (2013.01); *H04N 5/2254* (2013.01); *H04N 5/2257* (2013.01); *H01L 2224/48091* (2013.01); *H01L 2924/10155* (2013.01)

(58) Field of Classification Search
  USPC ................... 257/432; 348/294; 250/208.1
  See application file for complete search history.

(56) References Cited

U.S. PATENT DOCUMENTS

| | | | | |
|---|---|---|---|---|
| 2007/0228502 A1* | 10/2007 | Minamio | .......... | H01L 27/14618 257/431 |
| 2009/0115875 A1* | 5/2009 | Choi | ................. | H01L 27/14618 348/294 |
| 2012/0081587 A1* | 4/2012 | Ryu | ................. | H01L 27/14627 348/302 |
| 2014/0139711 A1* | 5/2014 | Sano | ..................... | G02B 13/18 348/294 |
| 2015/0334300 A1* | 11/2015 | Gabriel | ................. | H04N 5/247 348/218.1 |

FOREIGN PATENT DOCUMENTS

| | | |
|---|---|---|
| JP | 2008-092532 A | 4/2008 |
| JP | 2008-159823 A | 7/2008 |
| WO | 2006/064751 A | 6/2006 |

OTHER PUBLICATIONS

Written Opinion received for PCT Application No. PCT/JP2014/075847, dated Dec. 16, 2014, pp. 5.

International preliminary report on patentability for PCT Application No. PCT/JP2014/075847, dated Jun. 14, 2016, 5 pages.

* cited by examiner a b a b

EXAMPLE 1

EXAMPLE 1

EXAMPLE 1 a

——— S
- - - - M b

MERIDIONAL COMATIC ABERRATION

EXAMPLE 2

EXAMPLE 2

EXAMPLE 2 a

——— S
– – – M b

MERIDIONAL COMATIC ABERRATION

IMAGING UNIT, LENS BARREL, AND PORTABLE TERMINAL

CROSS REFERENCE TO RELATED APPLICATIONS

This application is a U.S. National Phase of International Patent Application No. PCT/JP2014/075847 filed on Sep. 29, 2014, which claims priority benefit of Japanese Patent Application No. JP 2013-253901 filed in the Japan Patent Office on Dec. 9, 2013. Each of the above-referenced applications is hereby incorporated herein by reference in its entirety.

TECHNICAL FIELD

The present technology relates to an imaging unit, a lens barrel, and a portable terminal. Specifically, it relates to an imaging unit, a lens barrel, and a portable terminal each including: a solid-state imaging element which is a solid-state imaging element such as a CCD image sensor or a CMOS image sensor and has a curved imaging surface; and an imaging lens preferable thereto.

BACKGROUND ART

In recent years, there are widely known small-sized imaging apparatuses using solid-state imaging elements such as a CCD (charged coupled device) or CMOS (Complementary Metal Oxide Semiconductor) image sensor. Such small-sized imaging apparatuses are now mounted onto portable terminals such as cellular phones, PDAs (Personal Digital Assistant) and the like, as well as notebook personal computers and the like, allowing not only audio information but also image information to be mutually transmitted to and from remote sites.

With solid-state imaging elements used for such imaging apparatuses, the pixel size becomes smaller recently to increase the number of pixels and achieve size reduction. Furthermore, it has become possible to curve the imaging surface, whereby a small-sized, high-performance imaging lens which is most suitable for such an imaging element can be obtained.

Patent Literature 1 discloses an imaging apparatus with a curved solid-state imaging element. Curving a solid-state imaging element into a polynomial surface shape corrects field curvature and distortion aberration occurring on the lens in a well-balanced manner, whereby a small-sized, high resolution imaging apparatus is provided. However, Patent Literature 1 does not disclose a specific method for curving the solid-state imaging element into a polynomial surface shape.

CITATION LIST

Patent Literature

Patent Literature 1: JP 2004-356175A

SUMMARY OF INVENTION

Technical Problem

As a result of intensive studies by the inventors of the present application, a method has been found which compresses a solid-state imaging element from the outer peripheral side so as to curve the imaging surface into a polynomial surface shape. However, the solid-state imaging element compressed from the outer peripheral side is elastically deformed, and therefore a force which acts to restore the shape to a plane occurs due to so-called spring-back. On the other hand, it is also conceivable to provide a beam on the back side of the solid-state imaging element so as to suppress spring-back of the solid-state imaging element. However, there is a problem that the above solution is not preferable because it is desired to make the length in the optical axis direction of the imaging unit as short as possible (height lowering) when mounting the solid-state imaging element on a portable terminal such as a smart phone.

The present technology, which has been made in view of the aforementioned problem, is directed to obtain an imaging unit, a lens barrel, and a portable terminal which can effectively suppress spring-back of solid-state imaging elements, while facilitating height lowering thereof.

Solution to Problem

A first aspect of the present technology, which has been made in view of the above problem, is an imaging unit including: a solid-state imaging element; and an imaging lens for forming a subject image on a photoelectric conversion part of the solid-state imaging element. An imaging surface of the solid-state imaging element is curved in a manner that a peripheral side is inclined toward an object side relative to a screen center. The imaging lens constrains the solid-state imaging element to prevent a radius of curvature of the imaging surface from varying.

According to the present technology, the imaging lens constrains the solid-state imaging element to prevent the radius of curvature of the imaging surface from varying so that, even when curving of the imaging surface of the solid-state imaging element causes spring-back, the radius of curvature of the imaging surface is maintained by resisting thereto, whereby field curvature, distortion aberration, and comatic aberration can be appropriately corrected. In addition, suppressing spring-back of the solid-state imaging element using the imaging lens at the object side of the solid-state imaging element allows downsizing and height lowering. Although it is assumed here that the curved shape of the imaging surface according to the present technology is curved in a manner that both the short side and the long side of the screen are similarly inclined to the object side toward the periphery of the screen, the shape need not necessarily be a spherical one, and may be any surface shape which can be expressed by a numerical formula, such as an aspherical, a paraboloidal, or an XY-polynomial one, and therefore it is possible to enhance the performance all over the screen by employing a shape that fits the shape of the field curvature generated in the lens system.

In the first aspect, an optical surface or a flange part of the imaging lens may abut on a peripheral part of the imaging surface of the solid-state imaging element.

The optical axis of the imaging lens is allowed to conform to the center of the solid-state imaging element by causing the optical surface or the flange part of the imaging lens to abut on the peripheral part of the imaging surface of the solid-state imaging element to exhibit a centering function. In addition, causing the optical surface or the flange part of the imaging lens to abut on the peripheral part of the imaging surface of the solid-state imaging element allows the interval between the imaging lens and the imaging surface of the solid-state imaging element to be precisely defined. Here, the optical surface includes the surface outside the effective diameter.

In the first aspect, a space between the imaging lens and the solid-state imaging element may be sealed.

Accordingly, it is possible to suppress sticking of foreign substance such as dust to the imaging surface. In addition, it is also possible to provide a medium other than the air layer such as liquid between the imaging lens and the solid-state imaging elements, whereby the optical characteristic can be improved.

In the first aspect, when seen from an optical axis direction, a portion of the imaging lens may extend from the solid-state imaging element in a direction orthogonal to an optical axis, a portion of the solid-state imaging element may extend from the imaging lens in a direction orthogonal to the optical axis, and wire connection for transmitting signals to an external circuit may be made to the portion of the solid-state imaging element.

Accordingly, wire connection of the solid-state imaging element is not prevented even when a portion of the imaging lens constrains the solid-state imaging element so as to extend in a direction orthogonal to the optical axis.

A second aspect of the present technology is an imaging unit including: a solid-state imaging element; and an imaging lens for forming a subject image on a photoelectric conversion part of the solid-state imaging element. An imaging surface of the solid-state imaging element is curved in a manner that a peripheral side is inclined toward an object side relative to a screen center. A frame member that suppresses parts other than the imaging surface of the solid-state imaging element is provided between the imaging lens and the solid-state imaging element to prevent a radius of curvature of the imaging surface from varying, and subject light which has passed through the imaging lens passes through the frame member and forms an image on the image forming surface.

According to the present technology, a frame member that suppresses parts other than the imaging surface of the solid-state imaging element is provided between the imaging lens and the solid-state imaging element to prevent the radius of curvature of the imaging surface from varying so that, even when curving of the imaging surface of the solid-state imaging element causes spring-back, the radius of curvature of the imaging surface is maintained by resisting thereto, whereby field curvature, distortion aberration, and comatic aberration can be appropriately corrected. In addition, spring-back of the solid-state imaging element is suppressed using the frame member provided between the solid-state imaging element and the imaging lens, which also allows downsizing and height lowering. Subject light which has passed through the imaging lens passes through the frame member and forms an image on the image forming surface, without preventing image capturing.

In addition, a micro lens may be provided on the image-side optical surface of the imaging lens in the first or second aspect.

Accordingly, production of the solid-state imaging element becomes easy.

In addition, a diameter of the micro lens may become gradually larger from the optical axis side toward the peripheral side in the first or second aspect.

Accordingly, it is possible to resolve the inconvenience when forming an image on the curved imaging surface of the solid-state imaging element with a micro lens provided on the image-side optical surface of the imaging lens.

In addition, a color filter may be provided on the image-side optical surface of the imaging lens in the first or second aspect.

Accordingly, production of the solid-state imaging element becomes easy.

A third aspect of the present technology is a lens barrel including the imaging unit in the first or second aspect.

A fourth aspect of the present technology is a portable terminal including the imaging unit in the first or second aspect.

Advantageous Effects of Invention

According to the present technology, it is possible to obtain an imaging unit, a lens barrel, and a portable terminal which can effectively suppress spring-back of a solid-state imaging element while facilitating height lowering thereof. The effects described herein are not limiting, and any of the effects described in the disclosure may be effective.

DESCRIPTION OF EMBODIMENTS

In the following, modes (referred to as embodiments below) for implementing the present technology will be described.

First Embodiment

Figure 1:
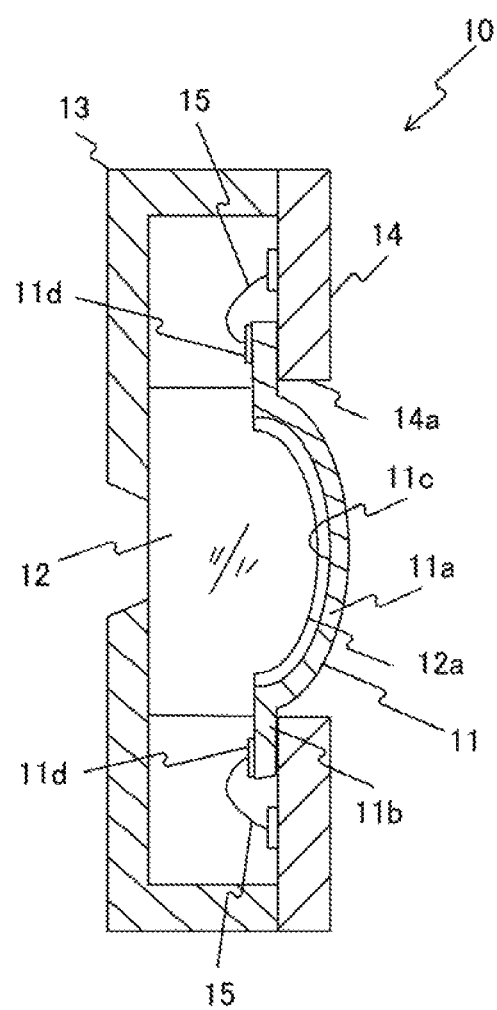
FIG. 1 is a cross-sectional view of an imaging unit 10 according to a first embodiment.
Figure 2:
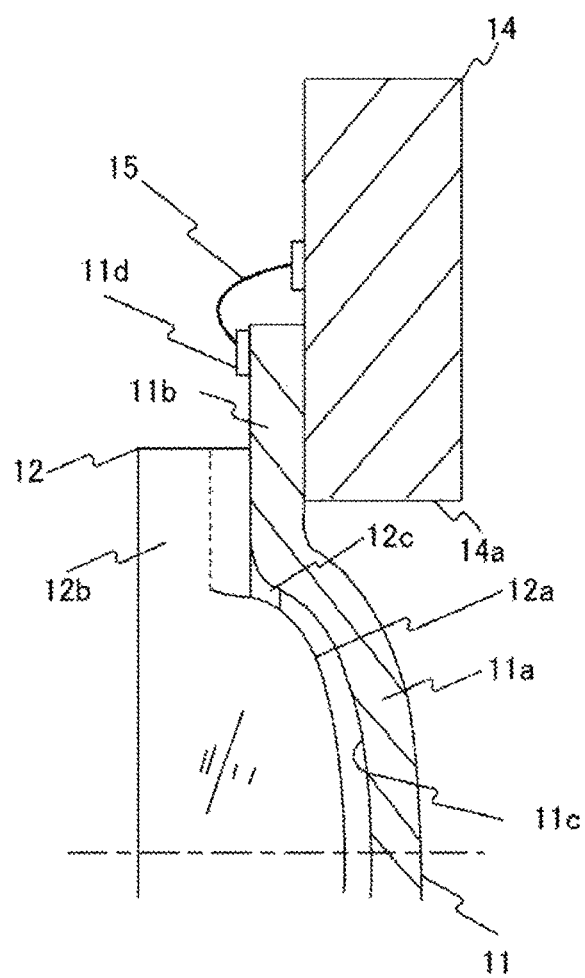
FIG. 2 is an enlarged cross-sectional view of a portion of the imaging unit 10.

FIG. 1 is a cross-sectional view of an imaging unit 10 according to a first embodiment. FIG. 2 is an enlarged cross-sectional view of a portion of the imaging unit 10.

As illustrated in FIG. 1, the imaging unit 10 includes a CMOS imaging element 11, an imaging lens 12, a housing 13, and a substrate 14 holding the imaging element 11, which are integrally formed. The CMOS imaging element 11 is a solid-state imaging element having an imaging surface 11c as a photoelectric conversion part. The imaging lens 12 is a lens for capturing a subject image on an imaging surface 11c on the imaging element 11. The housing 13 includes a light-shielding member having an aperture for receiving light incident from the object side.

The intermediate product of the imaging element 11 has a flat-plate shape and is curved into a hemispherical shape with a predetermined radius of curvature by being compressed from the outer peripheral side, and the imaging element 11 includes a central curved part 11a and a flat-plate part 11b around the curved part 11a. The imaging surface 11c is formed in the central part of the surface on the light receiving side of the curved part 11a as a light-receiving part having pixels (photoelectric conversion elements) arranged two-dimensionally, and a signal processing circuit (not illustrated) is formed around the imaging surface 11c. The signal processing circuit includes a drive circuit part which sequentially drives each pixel to obtain signal electric charge, an A/D conversion part which converts each signal electric charge into a digital signal, and a signal processing part which forms an image signal output using the digital signal, and the like. The imaging element is not limited to the aforementioned CMOS image sensor, and other types of elements such as CCD may be applied thereto. In addition, when not explicitly stated, a micro lens and a color filter are formed on the imaging surface 11c, although not illustrated.

The imaging element 11 has the flat-plate part 11b attached to the substrate 14 having an aperture 14a so as to accommodate a portion of the curved part 11a in the aperture 14a. A pad 11d is formed around the flat-plate part 11b of the imaging element 11, and the substrate 14 and the pad 11d are connected via a bonded wire 15 (wire connection). The wire 15 connects the imaging element 11 and an external circuit (for example, a control circuit included in an upper level device having an imaging unit installed therein) which is not illustrated. Accordingly, it is possible to receive voltage or clock signals for driving the imaging element 11 supplied from an external circuit, or output digital YUV signals to the external circuit.

The imaging lens 12 is provided at the imaging surface 11c side of the imaging element 11. As illustrated in FIG. 2, the imaging lens 12 has an image-side optical surface 12a arranged spaced apart by a predetermined distance (or in close contact therewith) in the optical axis direction relative to the imaging surface 11c, a flange part 12b around the image-side optical surface 12a, and a protrusion 12c provided between the image-side optical surface 12a and the flange part 12b. Causing the image-side face of the flange part 12b of the imaging lens 12 to abut on the flat-plate part 11b formed around the imaging surface 11c of the imaging element 11 allows the image-side optical surface 12a to be positioned relative to the imaging surface 11c in the optical axis direction. On the other hand, causing the protrusion 12c of the imaging lens 12 to abut on the curved part 11a around the imaging surface 11c of the imaging element 11 allows the imaging lens 12 to be positioned relative to the imaging surface 11c in a direction orthogonal to the optical axis. It is also possible to cause the image-side optical surface 12a itself of the imaging lens 12 to abut on the periphery of the imaging surface 11c of the imaging element 11.

In other words, according to the present embodiment, the radius of curvature of the imaging surface 11c is maintained by constraining the imaging element 11 by adhesively fixing the imaging lens 12 to the imaging element 11, and maintaining its shape by resisting the spring-back occurring in the imaging element 11. Accordingly, field curvature, distortion aberration, and comatic aberration can be appropriately corrected. In addition, spring-back of the imaging element 11 is suppressed using the imaging lens 12 at the object side of the imaging element 11, whereby downsizing and height lowering also become possible.

Applying an adhesive around the entire periphery of the imaging element 11 allows sealing the space between the imaging lens 12 and the imaging element 11. Accordingly, it is possible to suppress sticking of foreign substance such as dust to the imaging surface 11c. In addition, a medium other than air may be filled in the sealed space.

The substrate 14 has a housing 13 attached thereto, which shields the light around the imaging lens 12 and holds the imaging lens 12.

Figure 3:
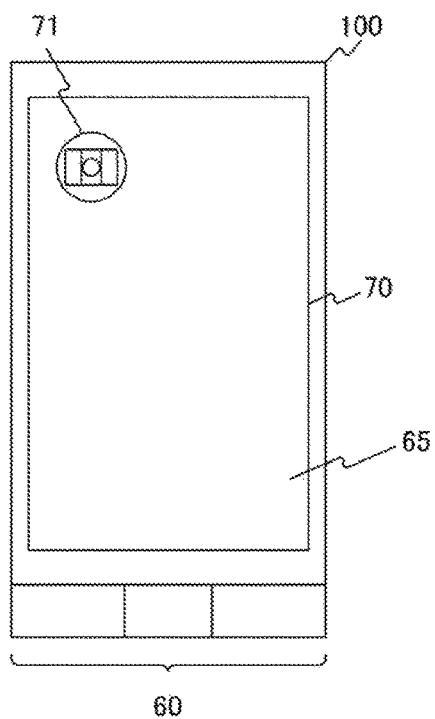
FIG. 3 illustrates a state in which the imaging unit 10 is installed on a smart phone 100 which is a portable terminal.
Figure 3:
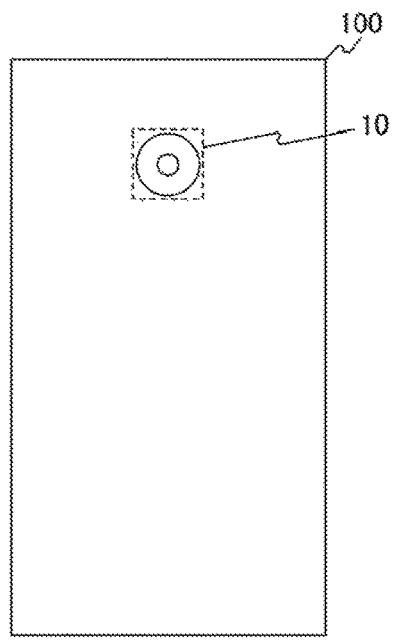

The operation of the aforementioned imaging unit 10 will be described. FIG. 3 illustrates a state in which the imaging unit 10 is installed on a smart phone 100 which is a portable terminal. In addition, FIG. 4 is a control block diagram of the smart phone 100.

The imaging unit 10 is installed at a position corresponding to the lower part of the liquid crystal display part, with the object side end face of the housing 13 being provided on the back side (see FIG. 3 (b)) of the smart phone 100, for example.

The imaging unit 10 is connected to a control part 101 of the smart phone 100 via an external connection terminal (the arrow in FIG. 4), and outputs image signals such as luminance signals or color difference signals to the control part 101 side.

Figure 4:
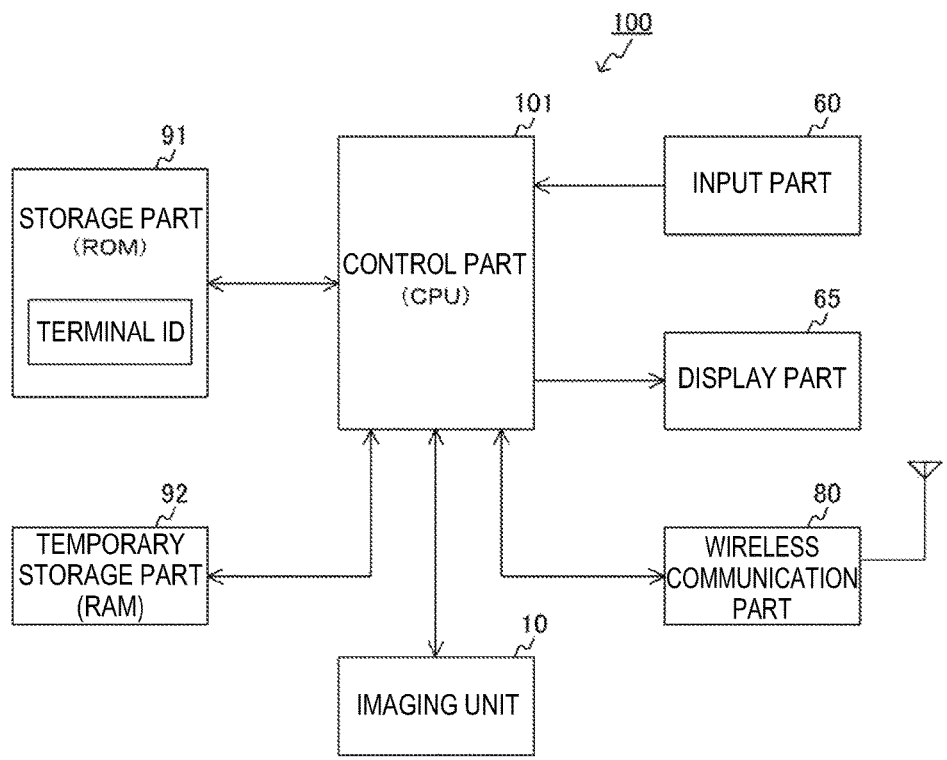
FIG. 4 is a control block diagram of the smart phone 100.

On the other hand, the smart phone 100 includes, as illustrated in FIG. 4, the control part (CPU) 101, an input part 60, a display part 65, a wireless communication part 80, a storage part (ROM) 91, and a temporary storage part (RAM) 92. The control part (CPU) 101 is configured to collectively control each part and execute a program according to each process. The input part 60 is configured to accept indications of switches such as the power source, numbers or the like, input via a touchpad. The display part 65 is configured to display captured images, or the like, in addition to predetermined data on the liquid crystal panel. However, the touch panel 70 works as both the liquid crystal panel of the display part and the touchpad of the input part. The wireless communication part 80 is configured to realize various information communication to and from an external server. The storage part (ROM) 91 is configured to store system programs and various processing programs of the smart phone 100 and a variety of required data such as terminal IDs. The temporary storage part (RAM) 92 is a work area for temporarily storing various processing programs to be executed by the control part 101 or data, processing data, imaging data obtained by the imaging unit 10 or the like.

The smart phone 100 operates by manipulation of the input key part 60, i.e., and can drive the imaging unit 10 to capture an image by touch of the icon 71, or the like, being displayed on the touch panel 70. Subject light forms an image on the imaging surface 11c of the imaging element 11 via the imaging lens 12. The image signal converted by the imaging unit 10 is stored in the storage part 92 by the control system of the smart phone 100, or displayed on the touch panel 70, and furthermore, transmitted to the outside as video information via the wireless communication part 80.

Second Embodiment

Figure 5:
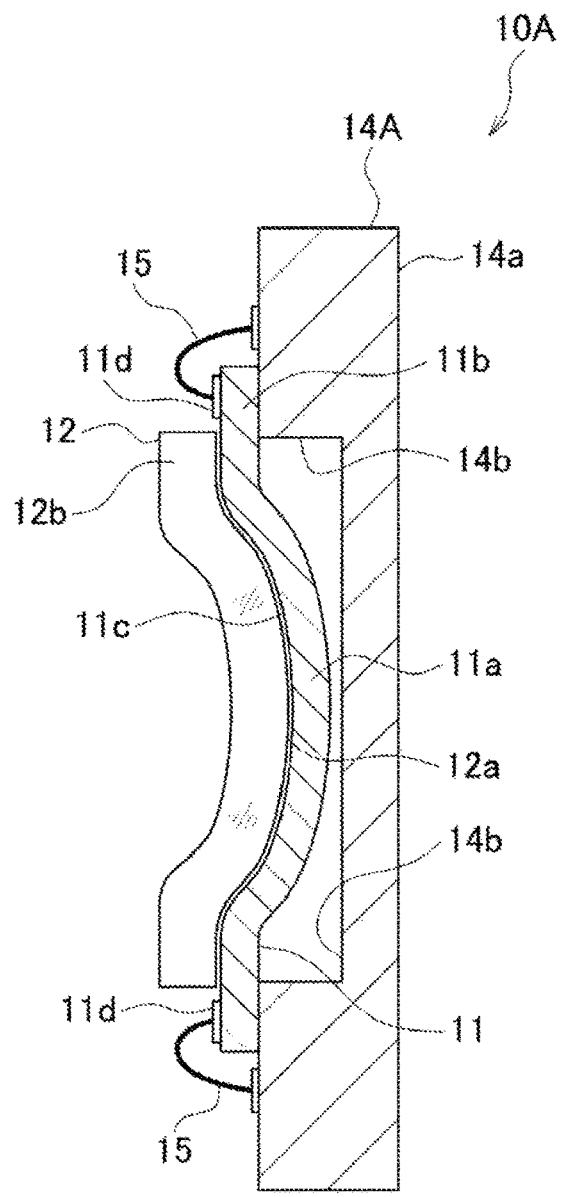
FIG. 5 is a cross-sectional view of an imaging unit 10A according to a second embodiment.

FIG. 5 is a cross-sectional view of an imaging unit 10A according to a second embodiment, with the housing being omitted. In the present embodiment, a substrate 14A has a cylindrical concave part 14b, with a portion of the imaging element 11 being accommodated in the concave part 14b. The rest of the configuration is similar to the aforementioned embodiment.

Third Embodiment

Figure 6:
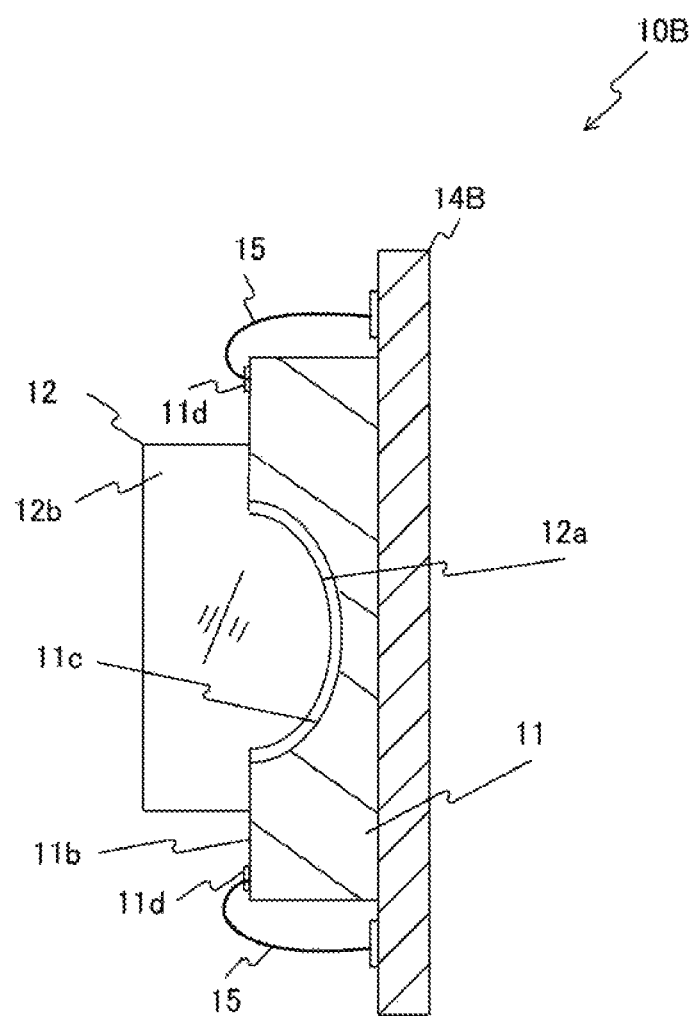
FIG. 6 is a cross-sectional view of an imaging unit 10B according to a third embodiment.

FIG. 6 is a cross-sectional view of an imaging unit 10B according to a third embodiment, with the housing being omitted. In the present embodiment, the entire back side (the side opposite to the imaging lens 12) of the block-shaped imaging element 11B is adhesively fixed to a parallel flat-plate substrate 14B, and the flange part 12b of the imaging lens 12 abuts on the object side face of the flat-plate part 11b of the imaging element 11A to be adhesively fixed thereto. The rest of the configuration is similar to the aforementioned embodiment.

Fourth Embodiment

Figure 7:
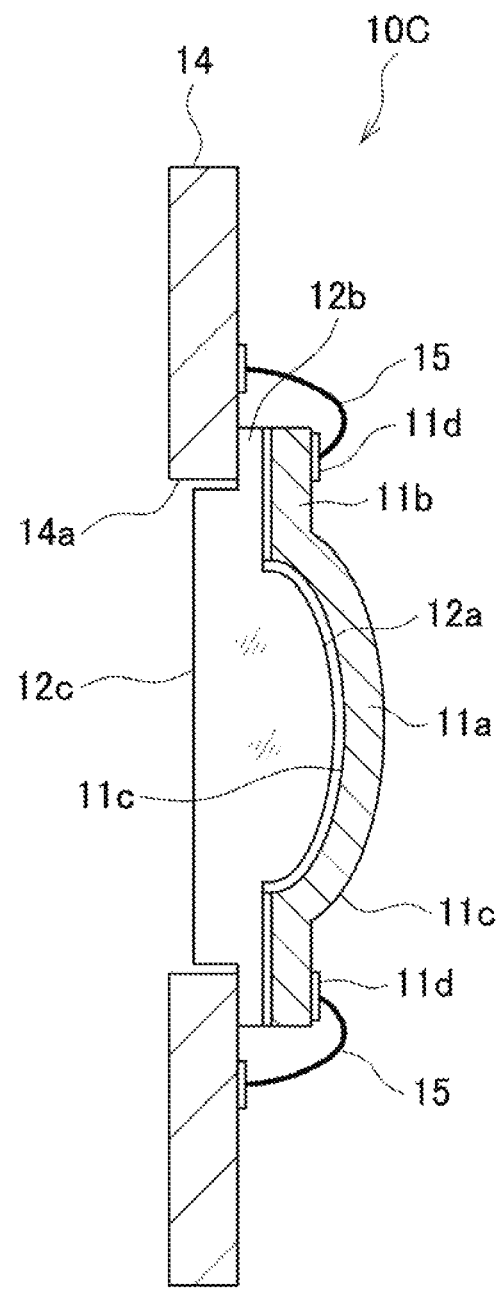
FIG. 7 is a cross-sectional view of an imaging unit 10C according to a fourth embodiment.

FIG. 7 is a cross-sectional view of an imaging unit 10C according to a fourth embodiment, with the housing being omitted. In the present embodiment, a portion of the imaging lens 12C is accommodated in the aperture 14a of the substrate 14. The imaging element 11C is adhesively fixed to the flange part 12b of the imaging lens 12, being supported relative to the substrate 14 thereby. The wire 15 extending from the back side of the substrate 14 is connected to the pad 11d provided on the back side (the side opposite to the imaging lens 12C) of the flat-surface part 12b of the imaging element 11C. The rest of the configuration is similar to the aforementioned embodiment.

Fifth Embodiment

Figure 8:
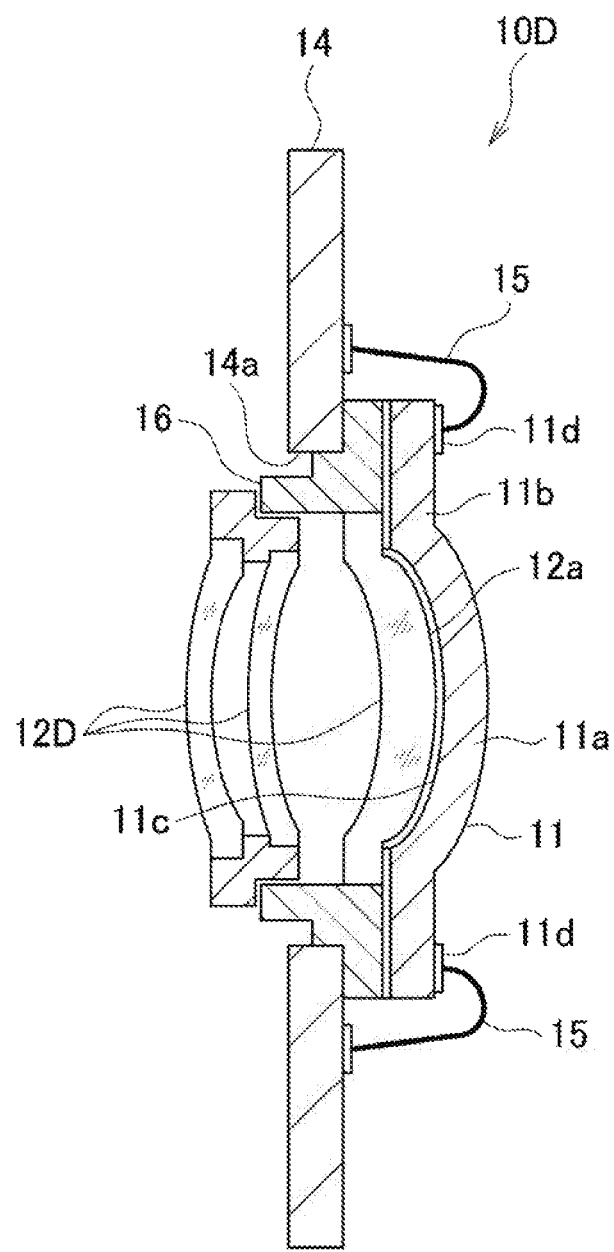
FIG. 8 is a cross-sectional view of an imaging unit 10D according to a fifth embodiment.

FIG. 8 is a cross-sectional view of an imaging unit 10D according to a fifth embodiment, with the housing being omitted. The difference of the present embodiment lies in that an imaging lens 12D, formed by three lenses, is fixed to the substrate 14 via a combination holder 16 so that the inter-lens distance is adjustable. The rest of the configuration is similar to the aforementioned embodiment.

Sixth Embodiment

Figure 9:
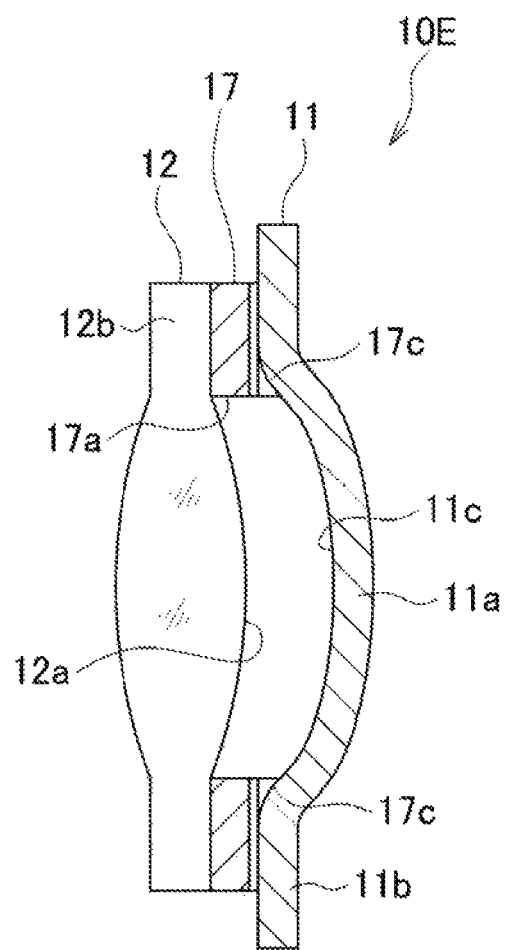
FIG. 9 is a cross-sectional view of an imaging unit 10E according to a sixth embodiment.

FIG. 9 is a cross-sectional view of an imaging unit 10E according to a sixth embodiment, with the housing being omitted. In the present embodiment, an annular frame member 17 is provided between the imaging lens 12 and the imaging element 11. The frame member 17, having an aperture 17a and a protrusion 17c protruding toward the imaging element 11 side, functions in the present embodiment as a holder for fixing the imaging lens 12 to a housing (not illustrated), and also functions as means for suppressing spring-back of the imaging element 11.

The imaging lens 12 can be positioned relative to the imaging surface 11c in the optical axis direction via the frame member 17 by causing the image-side face of the frame member 17 to abut on the flat-plate part 11b formed around the imaging surface 11c of the imaging element 11. On the other hand, the imaging lens 12 can be positioned relative to the imaging surface 11c in a direction orthogonal to the optical axis via the frame member 17 by causing the protrusion 17b of the frame member 17 to abut on the curved part 11a around the imaging surface 11c of the imaging element 11. Subject light having passed through the imaging lens 12 enters the imaging surface 11c via the aperture 17a of the frame member 17. Here, the imaging lens 12 and the frame member 17 may be separated from each other.

Seventh Embodiment

Figure 10:
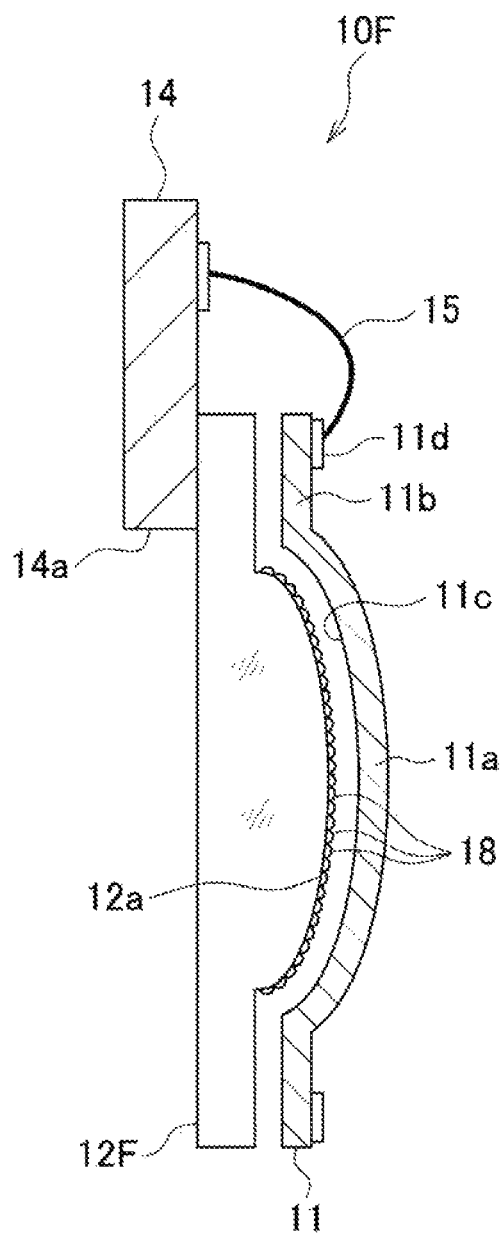
FIG. 10 is a cross-sectional view of an imaging unit 10F according to a seventh embodiment.

FIG. 10 is a cross-sectional view of an imaging unit 10F according to a seventh embodiment, with the housing being omitted. In the present embodiment, micro lenses 18 are formed on the image-side optical surface 12a of the imaging lens 12F, in a manner arranged in a matrix corresponding to the pixels of the imaging surface 11c. Accordingly, it becomes easy to form the imaging element 11 having the curved imaging surface 11c. The rest of the configuration is similar to the aforementioned embodiment.

Eighth Embodiment

Figure 11:
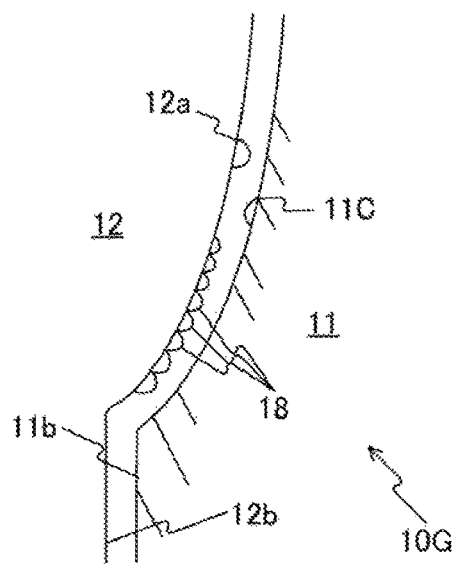
FIG. 11 illustrates an imaging unit 10G according to an eighth embodiment.
Figure 11:
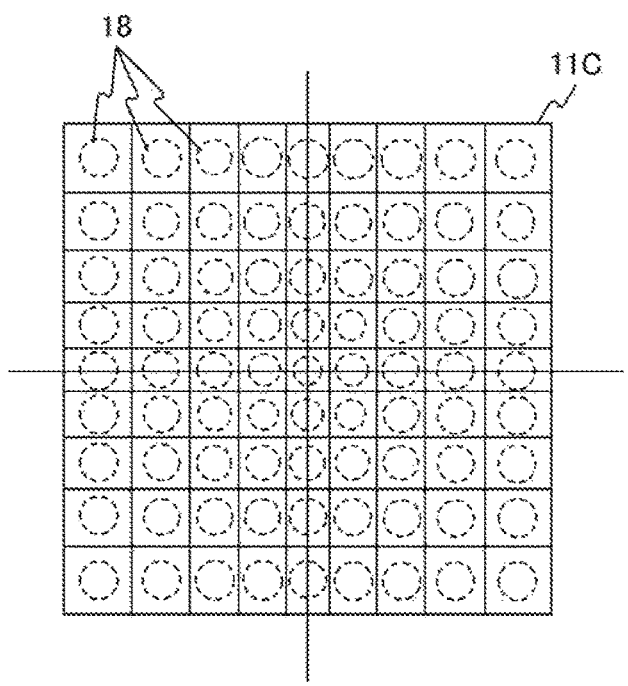

FIG. 11 (a) is a partial cross-sectional view of an imaging unit 10G according to an eighth embodiment (only a portion of the micro lenses 18 are illustrated), and FIG. 11 (b) is a view of the micro lenses 18 and the imaging surface 11c which are overlapped in the optical axis direction. In the present embodiment, the further away from the center, the larger the pixel size of the imaging surface 11c of the imaging element 11G is, and correspondingly, the further away from the optical axis, the larger the diameter of the micro lens 18 formed in the image-side optical surface 12a of the imaging lens 12G is. Accordingly, light-gathering characteristics can be enhanced. The rest of the configuration is similar to the aforementioned embodiment. Here, a color filter may be provided on the image-side optical surface 12a.

Ninth Embodiment

Figure 12:
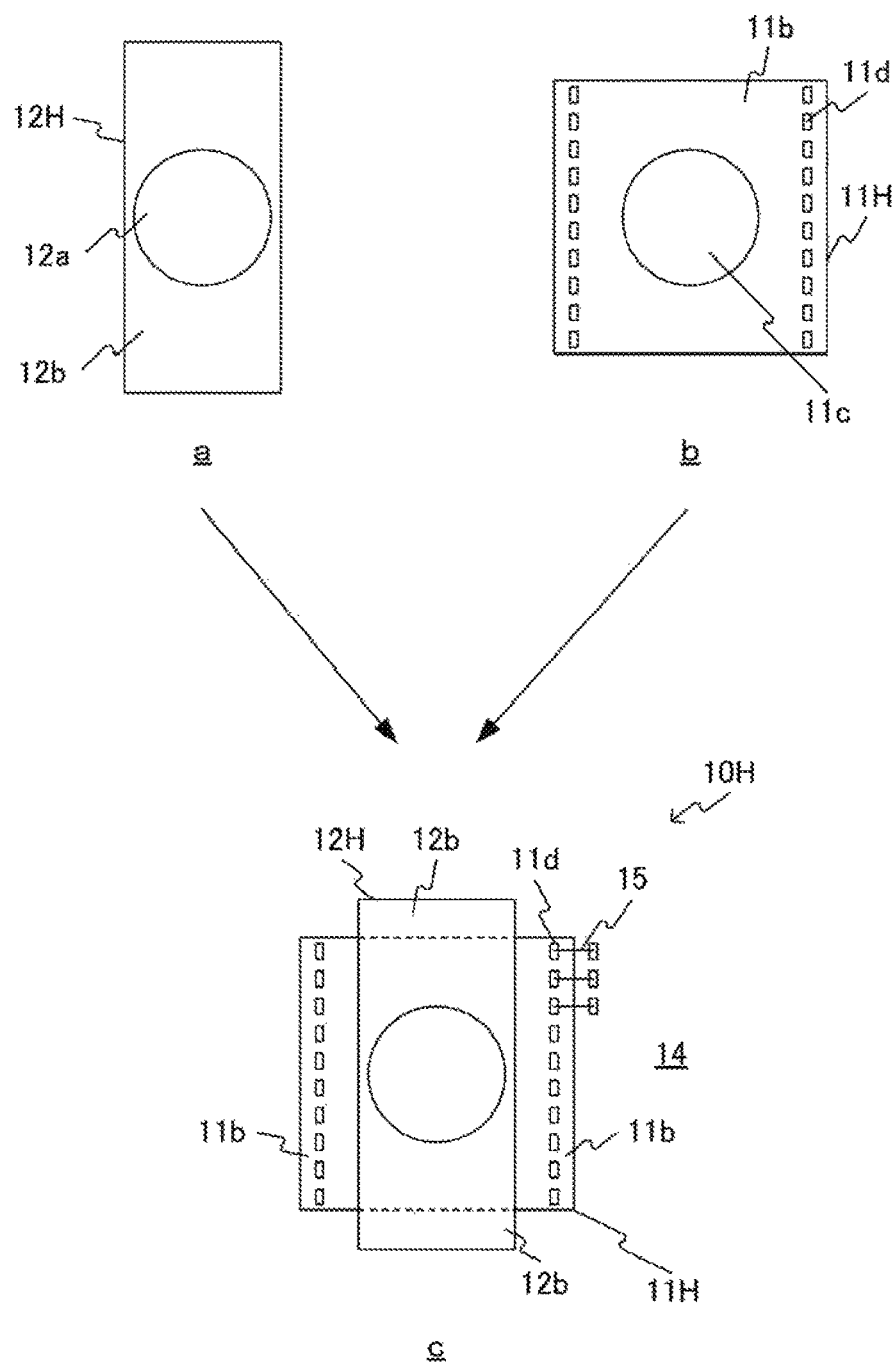
FIG. 12 illustrates an imaging unit 10H according to a ninth embodiment.

FIG. 12 (a) is a view of an imaging lens 12H for use in a ninth embodiment, seen from the optical axis direction. FIG. 12 (b) is a view of an imaging element 11H for use in the ninth embodiment, seen from the optical axis direction. FIG. 12 (c) is a view of the imaging lens 12H and the imaging element 11H which are overlapped in the optical axis direction. In the present embodiment, the flange part 12b of the imaging lens 12H extends from the imaging element 11H in a direction orthogonal to the optical axis (vertical direction in FIG. 12), as illustrated in FIG. 12 (c). A portion of the flat-surface part 11b of the imaging element 11H extends from the imaging lens 12H in a direction orthogonal to the optical axis (lateral direction in FIG. 12). The flat-surface part 11b spreading out of the imaging lens 12 of the imaging element 11H has the pad 11d provided thereon, which is connected by the wire 15 (only a portion is illustrated). The rest of the configuration is similar to the aforementioned embodiment.

Tenth Embodiment

Figure 13:
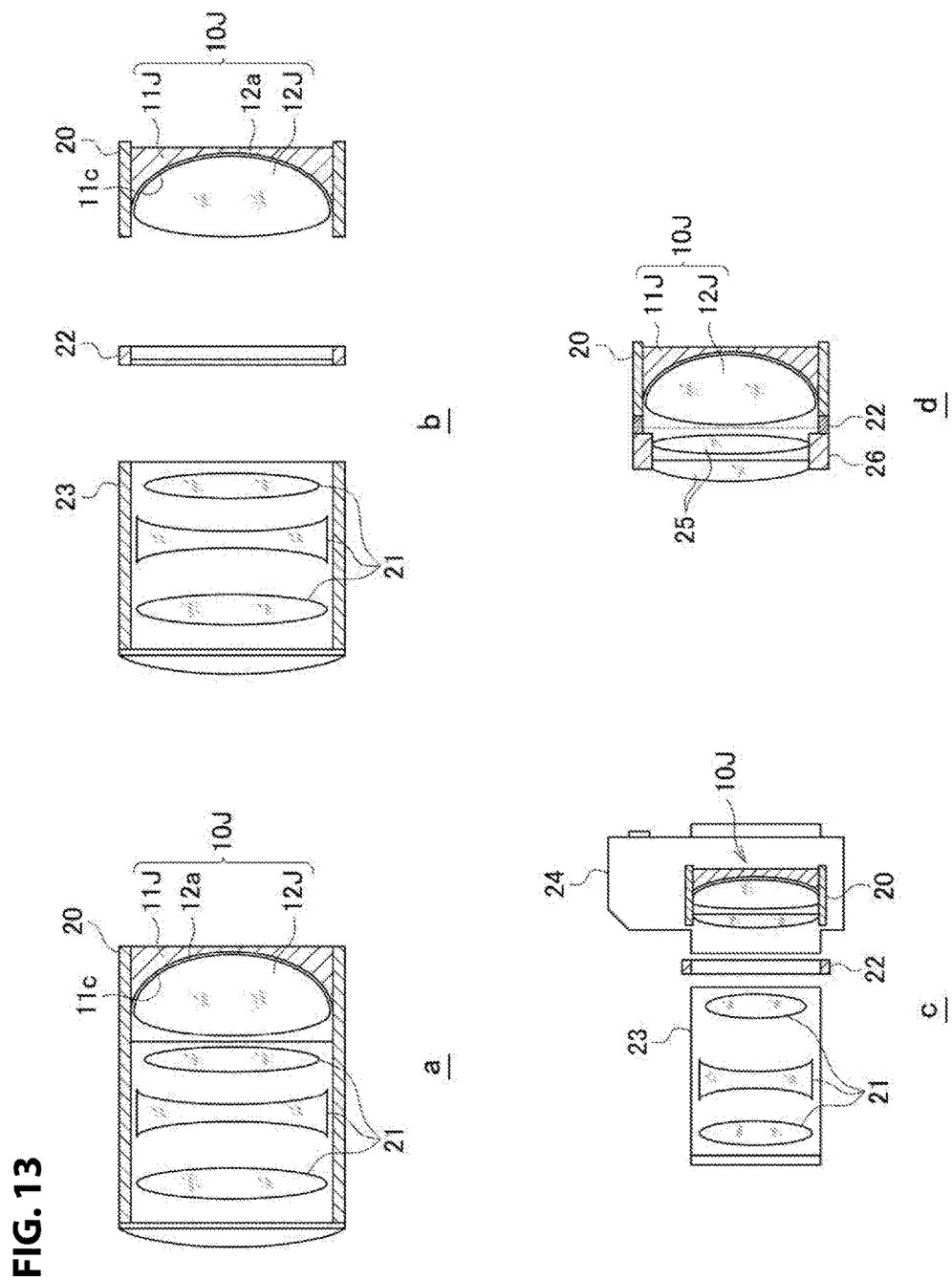
FIG. 13 illustrates an imaging unit 10J and an application thereof according to a tenth embodiment.
Figure 14:
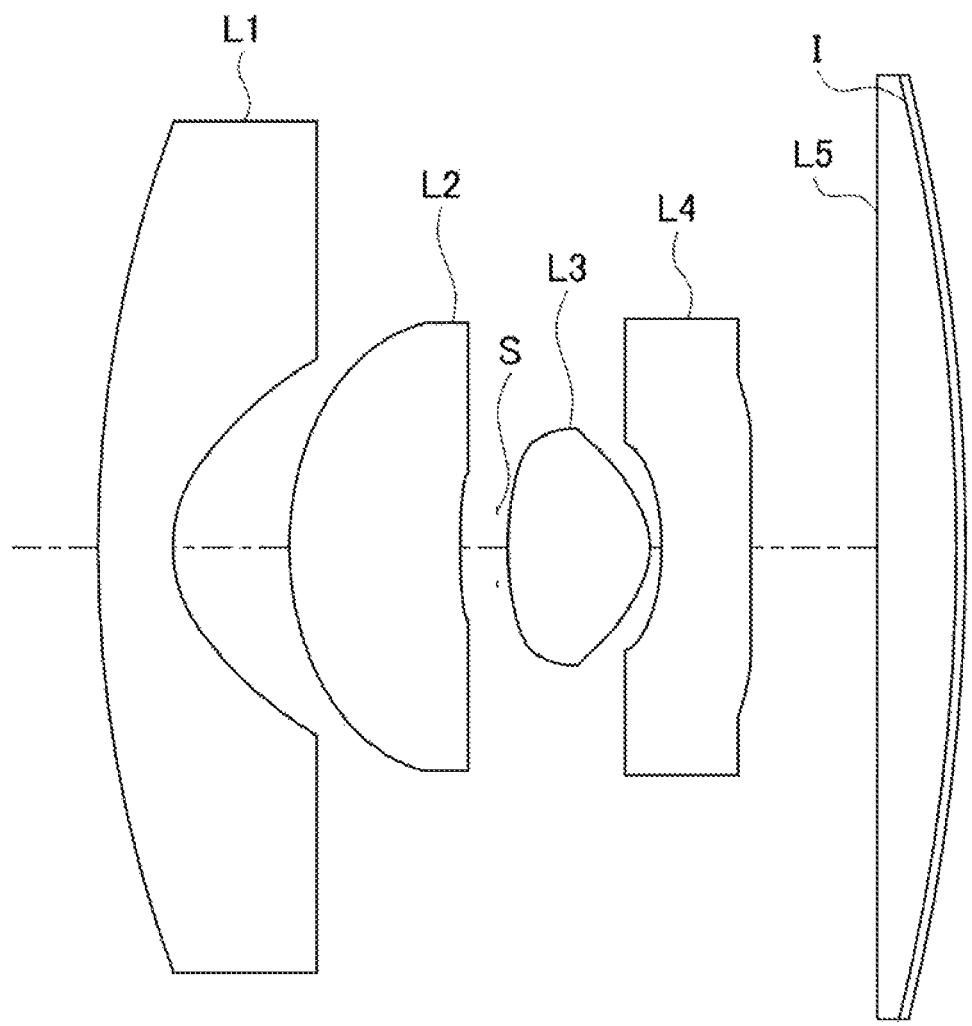
FIG. 14 is a cross-sectional view of an imaging lens of Example 1.

In the imaging unit 10J according to the present embodiment, the image-side optical surface 12a of the imaging lens 12J is attached to the curved imaging surface 11c of the imaging element 11H, as illustrated in FIG. 13. Although micro lenses and a color filter are provided between the image-side optical surface 12a and the imaging surface 11c, they need not necessarily be provided. The imaging unit 10J is provided in a tubular lens barrel 20. Here, a group of other lenses 21 can be arranged at the object side of the imaging lens 12J in the lens barrel 20 by extending the lens barrel 20 toward the object side, as illustrated in FIG. 13 (a).

In addition, as illustrated in FIG. 13 (b), in exchange for shortening the lens barrel 20 having the imaging unit 10J built therein, the lens barrel 20 may be coupled to another long lens barrel 23 having another group of lenses 21 built therein, via an annular coupling member 22. Accordingly, it is possible to provide a lens barrel with an imaging element for which any focal length may be selected. As a further application, it is conceivable to arrange the imaging unit 10J and the lens barrel 20 inside a camera body 24, as illustrated in FIG. 13 (c). Accordingly, it becomes possible to use a desired interchangeable lens by detachably coupling, via the annular joint member 22, the lens barrel 20 to another lens barrel 23 having a telephoto lens 21 built therein. In addition, as illustrated in FIG. 13 (d), it is also possible to mount the imaging unit 10J on the low-profile smart phone 100 as illustrated in FIG. 3, by coupling, via the annular coupling member 22, the lens barrel 20 to another short lens barrel 26 having a wide-angle lens 25 built therein. In other word, it becomes possible to mount the imaging unit 10J on any digital camera or smart phone, regardless of the model, with the basic configuration of the imaging unit 10J remaining unchanged.

EXAMPLES

Next, Examples of the imaging lens suitable for the aforementioned embodiments will be described. However, the present invention is not limited by the Examples described below. The symbols used in each Example are as follows:
f: focal length of entire imaging lens system
fB: back focus
F: F number
2Y: imaging surface diagonal length of solid-state imaging element
ENTP: entrance pupil position (distance from first surface to entrance pupil position)
EXTP: exit pupil position (distance from imaging surface to exit pupil position)
H1: front side main point position (distance from first surface to front side main point position)
H2: rear side main point position (distance from last surface to rear side main point position)
R: radius of curvature
D: axial surface separation
Nd: refractive index relative to d-line of lens material
vd: Abbe number of lens material In each Example, a surface with "*" after each surface number is an aspheric surface, and the aspheric surface is expressed by the following "Math. 1", with the apex of the surface being the origin, the X-axis taken in the optical axis direction, and the height perpendicular to the optical axis denoted by h.

$$X = \frac{h^2/R}{1 + \sqrt{1 - (1+K)h^2/R^2}} + \sum A_i h^i$$ [Math. 1]

where,
Ai: i-th order aspheric coefficient
R: radius of curvature
K: conic constant.

Example 1

Figure 15:
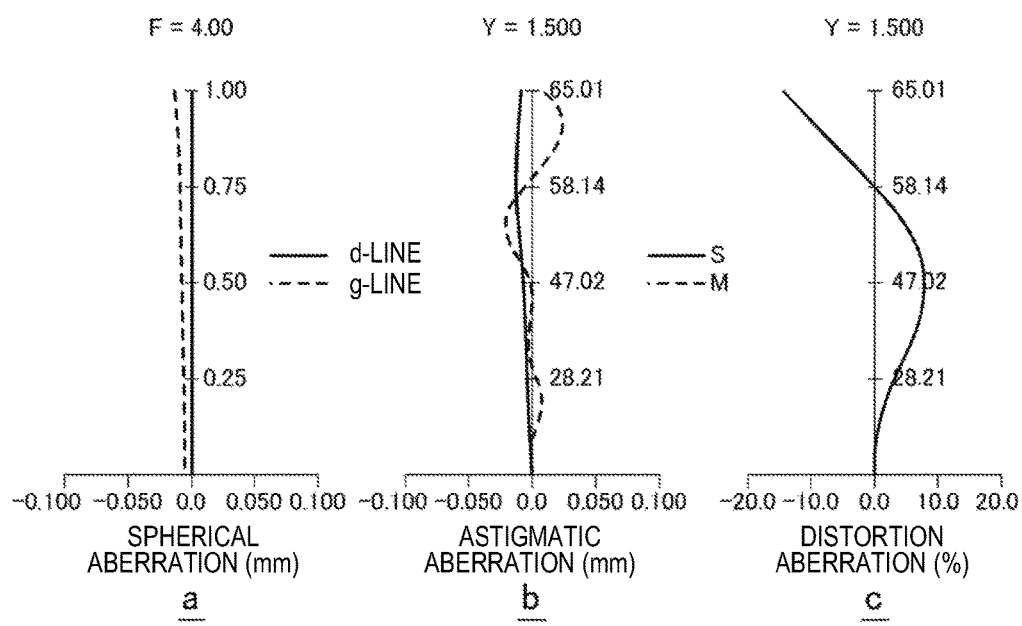
FIG. 15 illustrates an aberration (spherical aberration, astigmatic aberration, distortion aberration) of the imaging lens of Example 1.
Figure 16:
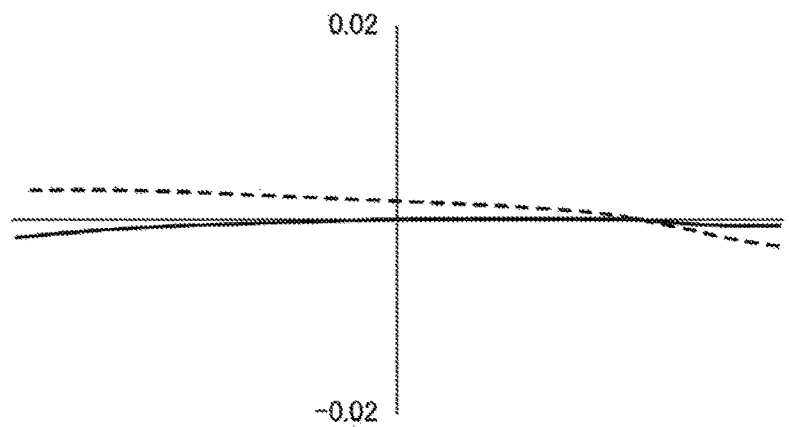
FIG. 16 illustrates meridional comatic aberration of Example 1.
Figure 16:
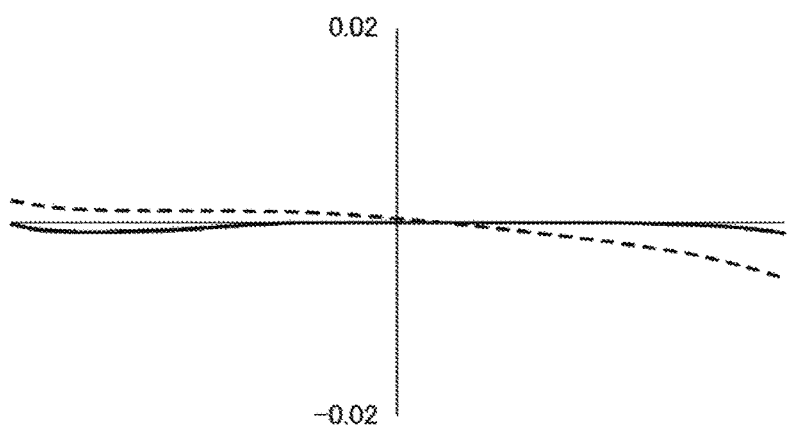

Lens data are listed in Table 1. In the following (including lens data in the Table), it is assumed that the power of ten (e.g., $2.5 \times 10^{-02}$) is expressed using E (e.g., $2.5E^{-02}$). FIG. 4 is a cross-sectional view of a lens of Example 1. In FIG. 1, L1 indicates the first lens, L2 the second lens, L3 the third lens, L4 the fourth lens, L5 the fifth lens, S the aperture diaphragm, and I the imaging surface. FIG. 15 (a) is a spherical aberration diagram of the Example 1, FIG. 15 (b) is an astigmatic aberration diagram, and FIG. 15 (c) is a distortion aberration diagram. FIG. 16 is a meridional comatic aberration diagram. Here, in the spherical aberration diagram, comatic aberration diagram and meridional comatic aberration diagram, g and d express the amount of spherical aberration along the g-line and the d-line, respectively. Additionally, in the astigmatic aberration diagram, the solid line S expresses the sagittal surface, and the dashed line M expresses the meridional surface, respectively (the same applies hereafter).

The overall specifications of the imaging lens of the Example 1 are listed below:
f=0.84 mm
fB=−0.04 mm
F=4
2Y=3 mm
ENTP=0.96 mm
EXTP=−2.17 mm
H1=1.47 mm
H2=−0.87 mm Surface data of the imaging lens of the Example 1 are listed below:

| surface number | R (mm) | D (mm) | Nd | vd | effective radius (mm) |
|---|---|---|---|---|---|
| 1 | ∞ | 0.00 | | | 2.30 |
| 2* | 38.031 | 0.40 | 1.58310 | 59.5 | 1.78 |
| 3* | 0.682 | 0.60 | | | 0.98 |
| 4* | 1.418 | 0.90 | 1.63470 | 23.9 | 0.87 |
| 5* | 3.612 | 0.19 | | | 0.38 |
| 6 (diaphragm) | ∞ | 0.05 | | | 0.18 |
| 7* | 1.427 | 0.74 | 1.53048 | 56.0 | 0.31 |
| 8* | −0.376 | 0.06 | | | 0.51 |
| 9* | −0.789 | 0.46 | 1.63470 | 23.9 | 0.54 |
| 10* | 9.008 | 0.65 | | | 0.88 |
| 11 | ∞ | 0.41 | 1.51630 | 64.1 | 1.36 |
| 12 | −10.000 | 0.05 | 1.51400 | 42.8 | 1.48 |
| 13 | −10.000 | | | | |

Aspheric coefficients of the Example 1 are listed below:
Second Surface
K=−0.50000E+02, A4=0.91594E−01, A6=−0.43298E−01, A8=0.90611E−02, A10=−0.96295E−03, A12=0.53811E−04
Third Surface
K=−0.10073E+01, A4=−0.42866E−01, A6=0.30980E+00, A8=0.33406E+00, A10=−0.11637E+01, A12=0.60040E+00
Fourth Surface
K=−0.97639E+01, A4=0.22056E+00, A6=−0.39971E−01, A8=0.18526E+00, A10=−0.35313E+00, A12=0.19096E+00

Fifth Surface
K=−0.46079E+01, A4=0.57221E+00, A6=0.13272E+01, A8=−0.81783E+01, A10=0.25511E+02, A12=−0.32938E+02
Seventh Surface
K=−0.26660E+01, A4=0.75905E−01, A6=0.44468E+00, A8=0.26032E+01, A10=−0.38162E+02, A12=0.13486E+03
Eighth Surface
K=−0.38839E+01, A4=−0.16438E+01, A6=0.39491E+01, A8=−0.13444E+02, A10=0.21046E+02, A12=0.23469E+01
Ninth Surface
K=−0.20091E+02, A4=−0.16831E+00, A6=−0.40405E+01, A8=0.70058E+01, A10=−0.61198E+01, A12=−0.29349E+02
Tenth Surface
K=−0.50000E+02, A4=−0.98947E−01, A6=−0.67924E−01, A8=−0.19606E+00, A10=0.31160E+00, A12=−0.13412E+00

Single-lens data of the imaging lens of the Example 1 are listed below:

| lens | initial surface | focal length (mm) |
|---|---|---|
| 1 | 2 | −1.195 |
| 2 | 4 | 3.175 |
| 3 | 7 | 0.651 |
| 4 | 9 | −1.112 |
| 5 | 11 | 19.296 |

Example 2

Figure 17:
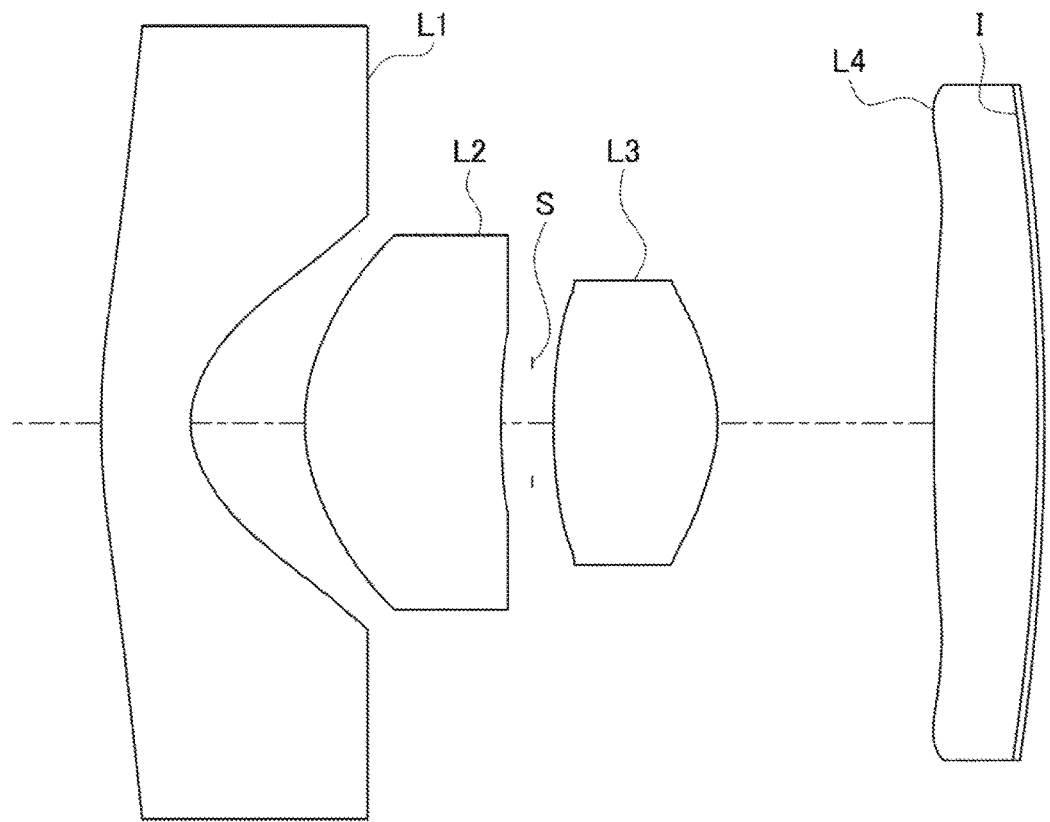
FIG. 17 is a cross-sectional view of an imaging lens of Example 2.
Figure 18:
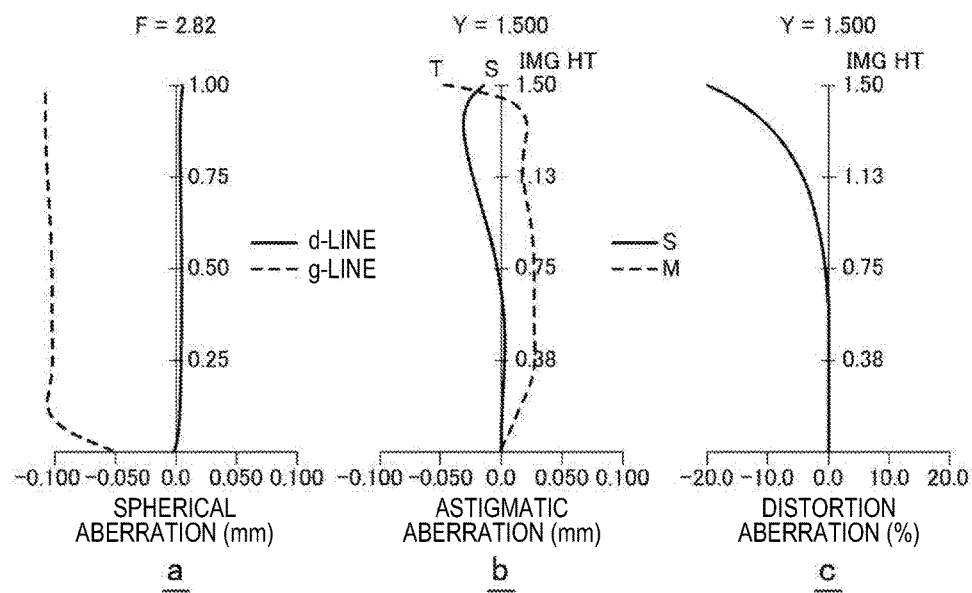
FIG. 18 illustrates the aberration (spherical aberration, astigmatic aberration, distortion aberration) of the imaging lens of Example 2.
Figure 19:
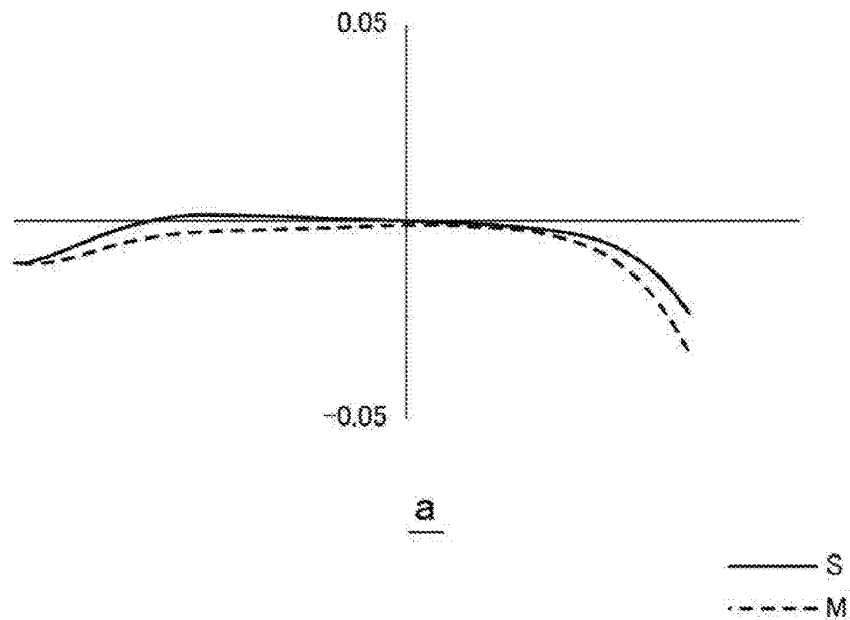
FIG. 19 illustrates meridional comatic aberration of Example 2.
Figure 19:
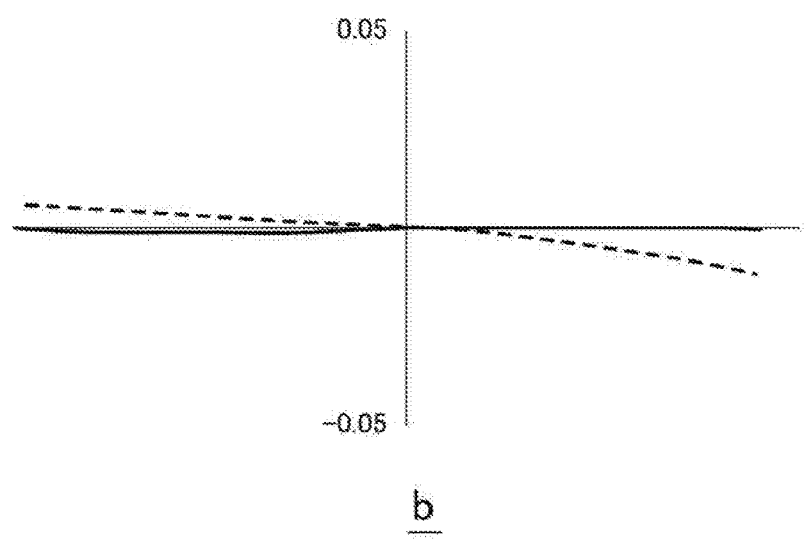

Lens data are listed in Table 2. FIG. 17 is a cross-sectional view of a lens of Example 2. In FIG. 17, L1 indicates the first lens, L2 the second lens, L3 the third lens, L4 the fourth lens, S the aperture diaphragm, and I the imaging surface. FIG. 18 (*a*) is a spherical aberration diagram of the Example 2, FIG. 18 (*b*) is an astigmatic aberration diagram, and FIG. 18 (*c*) is a distortion aberration diagram. FIG. 19 is a meridional comatic aberration diagram.

The overall specifications of the imaging lens of the Example 2 are listed below:
f=1.35 mm
fB=0 mm
F=2.82
2Y=3 mm
ENTP=0.96 mm
EXTP=−3.36 mm
H1=1.49 mm
H2=−0.89 mm Surface data of the imaging lens of the Example 2 are listed below:

| surface number | R (mm) | D (mm) | Nd | vd | effective radius (mm) |
|---|---|---|---|---|---|
| 1 | ∞ | 0.00 | | | 2.15 |
| 2* | 2.811 | 0.40 | 1.54470 | 56.2 | 1.76 |
| 3* | 0.428 | 0.51 | | | 0.92 |
| 4* | 0.878 | 0.87 | 1.63470 | 23.9 | 0.83 |
| 5* | 4.690 | 0.14 | | | 0.42 |
| 6 (diaphragm) | ∞ | 0.09 | | | 0.24 |
| 7* | 2.920 | 0.73 | 1.54470 | 56.2 | 0.38 |
| 8* | −0.778 | 0.97 | | | 0.63 |
| 9* | 171.080 | 0.46 | 1.51630 | 64.1 | 1.50 |
| 10 | −10.000 | 0.03 | 1.51400 | 42.8 | 1.50 |
| 11 | −10.000 | | | | |

Aspheric coefficients of the Example 2 are listed below:
Second Surface
K=−0.50000E+02, A4=0.80196E−03, A6=−0.26087E−02, A8=0.55773E−03, A10=−0.43133E−05
Third Surface
K=−0.82663E+00, A4=−0.51712E+00, A6=0.32110E+00, A8=−0.86436E+00, A10=0.10197E+00
Fourth Surface
K=−0.25111E+01, A4=0.28043E+00, A6=−0.19015E+00, A8=0.16628E+00, A10=−0.12696E+00, A12=0.10060E−10
Fifth Surface
K=0.21799E+02, A4=0.44802E+00, A6=−0.21419E+01, A8=0.30040E+02, A10=−0.94384E+02, A12=0.27246E−12
Seventh Surface
K=−0.50000E+02, A4=0.43277E+00, A6=−0.96506E+00, A8=0.69548E+01, A10=−0.13672E+02, A12=0.10000E−11
Eighth Surface
K=−0.10139E+01, A4=0.20724E+00, A6=0.97283E−02, A8=0.71893E+00, A10=−0.86320E−01, A12=0.50000E−11
Ninth Surface
K=0.00000E+00, A4=0.11510E+00, A6=−0.10125E+00, A8=0.41053E−02, A10=0.85133E−02, A12=0.40119E−11

Single-lens data of the imaging lens of the Example 2 are listed below:

| lens | initial surface | focal length (mm) |
|---|---|---|
| 1 | 2 | −0.987 |
| 2 | 4 | 1.564 |
| 3 | 7 | 1.213 |
| 4 | 10 | 18.246 |

It is apparent, from the Examples and ideas described in the specification, to those skilled in the art that the present invention is not limited to the Examples described in the present specification, and includes other Examples or variations.

The effects described in the present specification are merely illustrative and not limiting, and there may be other effects.

REFERENCE SIGNS LIST

10, 10A-10J imaging unit
11, 11A, 11B, 11C, 11G, and 11H imaging element
11*a* curved part
11*b* flat-plate part
11*c* imaging surface
11*d* pad
12, 12D, 12F, 12G, 12H, 12J imaging lens
12*a* image-side optical surface
12*b* flange part
12*c* protrusion housing 14, 14A, 14B substrate
14a aperture
14b concave part
15 wire
16 combination holder
17 frame member
17a aperture
17b protrusion
18 micro lens
20 lens barrel
21 telephoto lens
22 annular coupling member
23 long lens barrel
24 camera body
25 wide-angle lens
26 short lens barrel
60 input key part
65 display part
70 touch panel
71 icon
80 wireless communication part
92 storage part
100 smart phone
101 control part

The invention claimed is:

1. An imaging unit, comprising:
a solid-state imaging element; and
an imaging lens configured to form a subject image of a subject on a photoelectric conversion part of the solid-state imaging element, wherein
an imaging surface of the solid-state imaging element is curved such that a peripheral side of the imaging surface is inclined toward an object side relative to a screen center,
the imaging lens constrains the solid-state imaging element to prevent variation of a radius of curvature of the imaging surface,
when seen from an optical axis direction of the imaging surface:
a first portion of the imaging lens extends from the solid-state imaging element in a direction orthogonal to an optical axis of the imaging surface,
a second portion of the solid-state imaging element extends from the imaging lens in the direction orthogonal to the optical axis, and
a wire connection to the second portion of the solid-state imaging element transmits signals to an external circuit.

2. The imaging unit according to claim 1, wherein one of an optical surface or a flange part of the imaging lens abuts on a peripheral part of the imaging surface of the solid-state imaging element.

3. The imaging unit according to claim 1, wherein a space between the imaging lens and the solid-state imaging element is sealed.

4. The imaging unit according to claim 1, wherein the imaging unit is included in a lens barrel.

5. The imaging unit according to claim 1, wherein the imaging unit is included in a portable terminal.

6. An imaging unit, comprising:
a solid-state imaging element;
an imaging lens configured to form a subject image of a subject on a photoelectric conversion part of the solid-state imaging element,
wherein an imaging surface of the solid-state imaging element is curved such that a peripheral side of the imaging surface is inclined toward an object side relative to a screen center; and
a frame member between the imaging lens and the solid-state imaging element,
wherein the frame member suppresses parts other than the imaging surface of the solid-state imaging element to prevent variation of a radius of curvature of the imaging surface, and subject light which has passed through the imaging lens passes through the frame member and forms the subject image on an image forming surface.

7. The imaging unit according to claim 6, further comprising a micro lens on an image-side optical surface of the imaging lens.

8. The imaging unit according to claim 7, wherein a diameter of the micro lens increases from an optical axis of the imaging surface toward the peripheral side.

9. The imaging unit according to claim 8, further comprising a color filter on the image-side optical surface of the imaging lens.

10. An imaging unit, comprising:
a solid-state imaging element; and
an imaging lens configured to form a subject image of a subject on a photoelectric conversion part of the solid-state imaging element, wherein
an imaging surface of the solid-state imaging element is curved such that a peripheral side of the imaging surface is inclined toward an object side relative to a screen center,
the imaging lens constrains the solid-state imaging element to prevent variation of a radius of curvature of the imaging surface, and
an optical surface or a flange part of the imaging lens abuts on a peripheral part of the imaging surface of the solid-state imaging element.

11. An imaging unit, comprising:
a solid-state imaging element; and
an imaging lens configured to form a subject image of a subject on a photoelectric conversion part of the solid-state imaging element, wherein
an imaging surface of the solid-state imaging element is curved such that a peripheral side of the imaging surface is inclined toward an object side relative to a screen center,
the imaging lens constrains the solid-state imaging element to prevent variation of a radius of curvature of the imaging surface, and
a space between the imaging lens and the solid-state imaging element is sealed.

* * * * *